United States Patent
Kim et al.

(10) Patent No.: US 12,408,271 B2
(45) Date of Patent: Sep. 2, 2025

(54) PRINTED CIRCUIT BOARD AND DISPLAY DEVICE INCLUDING THE SAME

(71) Applicant: Samsung Display Co., Ltd., Yongin-si (KR)

(72) Inventors: Jooyoung Kim, Asan-si (KR); Kihae Shin, Cheonan-si (KR); Youngjin Park, Seoul (KR); Hyunseop Song, Bucheon-si (KR); Byungchul Shin, Gwangju-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 171 days.

(21) Appl. No.: 18/098,374

(22) Filed: Jan. 18, 2023

(65) Prior Publication Data

US 2023/0300981 A1   Sep. 21, 2023

(30) Foreign Application Priority Data

Mar. 15, 2022   (KR) .................... 10-2022-0032070

(51) Int. Cl.
  *H05K 1/11*  (2006.01)
  *G09F 9/30*  (2006.01)
(52) U.S. Cl.
  CPC .............. *H05K 1/111* (2013.01); *G09F 9/301* (2013.01); *H05K 2201/09418* (2013.01); *H05K 2201/10128* (2013.01)

(58) Field of Classification Search
  CPC .......................................... H05K 1/112–1/117
  See application file for complete search history.

(56) References Cited

U.S. PATENT DOCUMENTS

| | | | | |
|---|---|---|---|---|
| 2003/0218258 | A1* | 11/2003 | Charles ................. | H01L 23/293 257/E21.503 |
| 2007/0013857 | A1* | 1/2007 | Chung ................ | G02F 1/13452 349/152 |
| 2019/0354219 | A1* | 11/2019 | Chang ............... | H01L 23/49816 |
| 2021/0091162 | A1* | 3/2021 | Kim .................... | G02F 1/13452 |

FOREIGN PATENT DOCUMENTS

| | | |
|---|---|---|
| JP | 2014067769 A | 4/2014 |
| KR | 1020070057483 A | 6/2007 |
| KR | 100790575 B1 | 1/2008 |

* cited by examiner

*Primary Examiner* — Jeremy C Norris
(74) *Attorney, Agent, or Firm* — CANTOR COLBURN LLP

(57) ABSTRACT

A printed circuit board includes: a base member, a first line and a second line disposed on the base member, and a plurality of pad portions disposed on the base member. Each of the plurality of pad portions includes: a first input pad and a second input pad connected to the first line, respectively, and which receives an electrical signal or voltage. Each of the plurality of pad portions includes a first output pad and a second output pad connected to the second line, respectively, and which provide the electrical signal or the voltage to a display panel.

20 Claims, 9 Drawing Sheets

PRINTED CIRCUIT BOARD AND DISPLAY DEVICE INCLUDING THE SAME

This application claims priority to Korean Patent Application No. 10-2022-0032070, filed on Mar. 15, 2022, and all the benefits accruing therefrom under 35 U.S.C. § 119, the content of which in its entirety is herein incorporated by reference.

BACKGROUND

1. Field

Embodiments provide generally to a printed circuit board. More particularly, embodiments relate to the printed circuit board and a display device the same.

2. Description of the Related Art

With the development of information technology, the importance of a display device, which is a connecting medium between a user and information, is being emphasized. For example, the use of display devices such as liquid crystal display device ("LCD"), organic light emitting display device ("OLED"), plasma display device ("PDP"), quantum dot display device, or the like is increasing.

In general, the display device may include two or more electronic components. For example, the display device may include a display panel that displays an image, a printed circuit board ("PCB"), or the like.

When electrically connecting the pads of the printed circuit board, a soldering process may be performed. However, defects such as the pads not being electrically connected may occur during the soldering process.

SUMMARY

Embodiment provides a printed circuit board with improved defects.

Embodiment provides a display device including the printed circuit board.

A printed circuit board according to an embodiment of the present invention includes: a base member, a first line and a second line disposed on the base member, and a plurality of pad portions disposed on the base member. Each of the pad portions includes: a first input pad and a second input pad connected to the first line, respectively, and which receive an electrical signal or voltage; and a first output pad and a second output pad connected to the second line, respectively, and which provide the electrical signal or the voltage to a display panel.

In an embodiment, each of the first input pad, the second input pad, the first output pad, and the second output pad may have a rectangular shape in a plan view.

In an embodiment, each of the first input pad, the second input pad, the first output pad, and the second output pad may have any one of a triangular shape, a square shape, and an L-shape in a plan view.

In an embodiment, the first input pad and the second input pad may be spaced apart from each other in a first diagonal direction between a first direction and a second direction orthogonal to the first direction in a plan view. The first output pad and the second output pad may be spaced apart from each other in a second diagonal direction between the first direction and a direction opposite to the second direction in the plan view.

In an embodiment, the first input pad may be disposed in a first row and a first column, the first output pad may be disposed in a second row adjacent to the first row and the first column, the second input pad may be disposed in the second row and a second column adjacent to the first column, and the second output pad may be disposed in the first row and the second column.

In an embodiment, the printed circuit board may further include a connection layer disposed on the base member and including a metal material.

In an embodiment, the metal material may include lead (Pb).

In an embodiment, the connection layer may be in contact with the first input pad and the first output pad, respectively.

In an embodiment, the connection layer may be in contact with the second input pad and the second output pad, respectively.

In an embodiment, the connection layer may be in contact with the first input pad and the second output pad, respectively.

In an embodiment, the first line may be monolithic with the first input pad and the second input pad, and the second line may be monolithic with first output pad and the second output pad.

In an embodiment, the first line may include: a first connection line electrically connected to the first input pad, and a first bridge line disposed between the first input pad and the second input pad in a plan view, and electrically connected to each of the first input pad and the second input pad through a first through hole.

In an embodiment, the second line may include: a second connection line electrically connected to the second output pad, and a second bridge line disposed between the first output pad and the second output pad in a plan view, and electrically connected to each of the first output pad and the second output pad through a second through hole.

A display device according to an embodiment of the present invention includes: a display panel including a display area, a bending area, and a pad area; and a printed circuit board disposed in the pad area on the display panel. The printed circuit board includes: a base member; a first line and a second line disposed on the base member; and a plurality of pad portions disposed on the base member. Each the pad portions includes: a first input pad and a second input pad connected to the first line, respectively, and which receives an electrical signal or voltage, and a first output pad and a second output pad connected to the second line, respectively, and which provides the electrical signal or the voltage to a display panel.

In an embodiment, each of the first input pad, the second input pad, the first output pad, and the second output pad may have any one of a triangular shape, a square shape, and an L-shape in a plan view.

In an embodiment, the first input pad and the second input pad may be spaced apart from each other in a first diagonal direction between a first direction and a second direction orthogonal to the first direction in a plan view. The first output pad and the second output pad may be spaced apart from each other in a second diagonal direction between the first direction and a direction opposite to the second direction in the plan view.

In an embodiment, the printed circuit board may further include: a connection layer disposed on the base member, including a metal, and in contact with an input pad including the first input pad or the second input pad and an output pad including the first output pad or the second output pad, respectively.

In an embodiment, the metal material may include lead (Pb).

In an embodiment, the first line may be monolithic with the first input pad and the second input pad, and the second line may be monolithic with first output pad and the second output pad.

In an embodiment, the first line may include: a first connection line electrically connected to the first input pad, and a first bridge line disposed between the first input pad and the second input pad in a plan view, and electrically connected to each of the first input pad and the second input pad through a first through hole.

In a printed circuit board according to an embodiment of the present invention, each of the plurality of optional pad portions of the printed circuit board may include a first input pad and a second input pad that receive an electrical signal or voltage, and may include a first output pad and a second output pad that provide an electrical signal or voltage to a display panel. That is, each of the optional pad portions of the printed circuit board may include two input pads and two output pads. Accordingly, the possibility of a short between any one of the input pads and any one of the output pads may be improved. In this case, defects of the printed circuit board may be effectively reduced.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
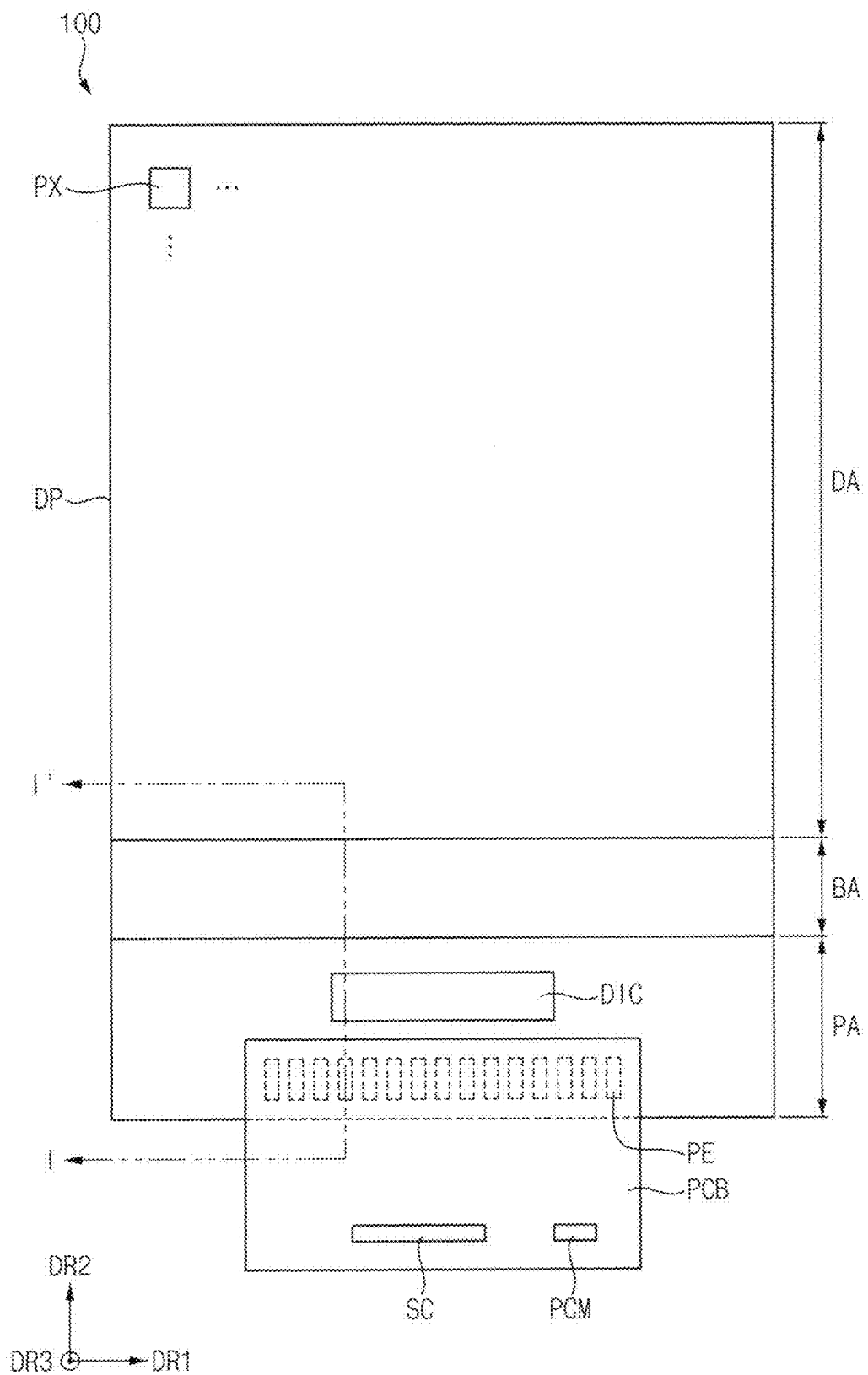
FIG. 1 is a plan view illustrating a display device according to an embodiment.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, embodiments of the present disclosure will be explained in detail with reference to the accompanying drawings. The same reference numerals are used for the same components in the drawings, and redundant descriptions of the same components will be omitted.

Figure 2:
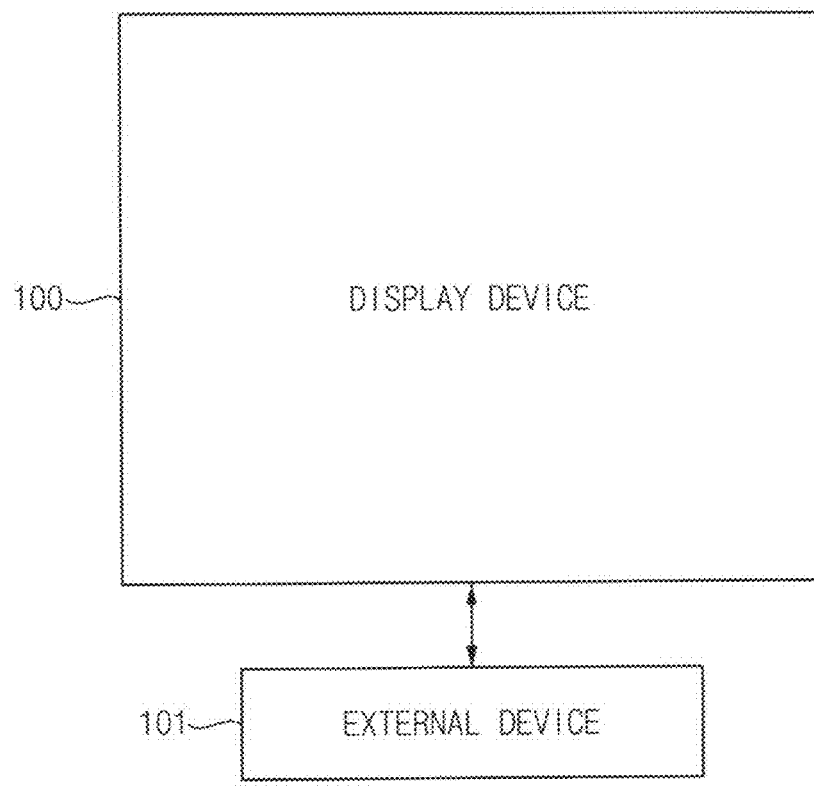
FIG. 2 is a block diagram illustrating an external device electrically connected to the display device of FIG. 1.

FIG. 1 is a plan view illustrating a display device according to an embodiment. FIG. 2 is a block diagram illustrating an external device electrically connected to the display device of FIG. 1. For example, the display device 100 illustrated in FIG. 1 is in a state before the display panel DP is bent.

Referring to FIGS. 1 and 2, the display device 100 according to an embodiment may include a display panel DP, a driving integrated circuit DIC, a printed circuit board PCB, a signal control circuit SC, and a power control module PCM. Here, the display panel DP may include pad electrodes PE and a plurality of pixels PX.

The display panel DP may be divided into a display area DA, a bending area BA, and a pad area PA. The pad area PA may be spaced apart from one side of the display area DA in a direction opposite to the second direction DR2 perpendicular to the upper side of the display panel DP. The bending area BA may be positioned between the display area DA and the pad area PA in a plan view.

As illustrated in FIG. 2, an external device 101 may be electrically connected to the display device 100. For example, the external device 101 may be electrically connected to the display device 100 through a printed circuit board PCB. The external device 101 may generate an electrical signal, a voltage, or the like to display an image on the display panel DP.

The pad electrodes PE may be disposed in the pad area PA. The pad electrodes PE may be disposed to be spaced apart from each other in the first direction DR1. Here, the first direction DR1 may be a direction substantially parallel to the upper side of the display device 100. Some of the pad electrodes PE may be connected to the driving integrated circuit DIC through lines, and the rest of the pad electrodes PE may be connected to the plurality of pixels PX through lines. For example, each of the pad electrodes PE may include a metal, an alloy, a metal nitride, a conductive metal oxide, a transparent conductive material, or the like. These may be used alone or in combination with each other.

One end of the printed circuit board PCB may be electrically connected to the pad electrodes PE of the display panel DP and the other end of the printed circuit board PCB may be electrically connected to the external device 101. That is, the electrical signal and the voltage generated from the external device 101 may be provided to the driving integrated circuit DIC and the plurality of pixels PX through the printed circuit board PCB.

Components for receiving the electrical signal or voltage supplied from the external device 101 and transmitting the received electrical signal or voltage to the display panel DP may be disposed on the printed circuit board PCB. For example, the signal control circuit SC for controlling the electrical signals provided to the display panel DP may be disposed on the printed circuit board PCB. In addition, the power control module PCM for controlling the voltage provided to the display panel DP may be disposed on the printed circuit board PCB.

The driving integrated circuit DIC may be disposed in the pad area PA on the display panel DP. The driving integrated circuit DIC may convert a digital data signal among the electrical signals into an analog data signal and provide the analog data signal to the plurality of pixels PX. For example, the driver integrated circuit DIC may be a data driver. Alternatively, the display device 100 may further include a gate driver. In this case, the gate driver may be disposed on one side of the display area DA.

The plurality of pixels PX may be disposed in the display area DA. Each of the plurality of pixels PX may emit light. The plurality of pixels PX may be arranged in the first direction DR1 and the second direction DR2 in the display area DA. Here, the second direction DR2 may be a direction substantially orthogonal to the first direction DR1. Lines connected to the plurality of pixels PX may be further disposed in the display area DA. For example, the lines may include a data signal line, a gate signal line, a power supply line, or the like.

However, although each of the display area DA, the bending area BA, and the pad area PA of the present invention is illustrated as having a rectangular planar shape in FIG. 1, the present invention is not limited thereto. For example, the shape of each of the display area DA, the bending area BA, and the pad area PA may be a triangular planar shape, a rhombus planar shape, a circular planar shape, a track-type planar shape, or an elliptical planar shape.

In FIG. 1, the driving integrated circuit DIC of the present invention is illustrated as having a chip on plastic COP structure or a chip on glass COG structure directly disposed on the display panel DP, the present invention is not limited thereto. For example, the driver integrated circuit DIC may have a chip on film COF structure disposed directly on a flexible film. In this case, the printed circuit board PCB may be electrically connected to the flexible film.

Figure 3:
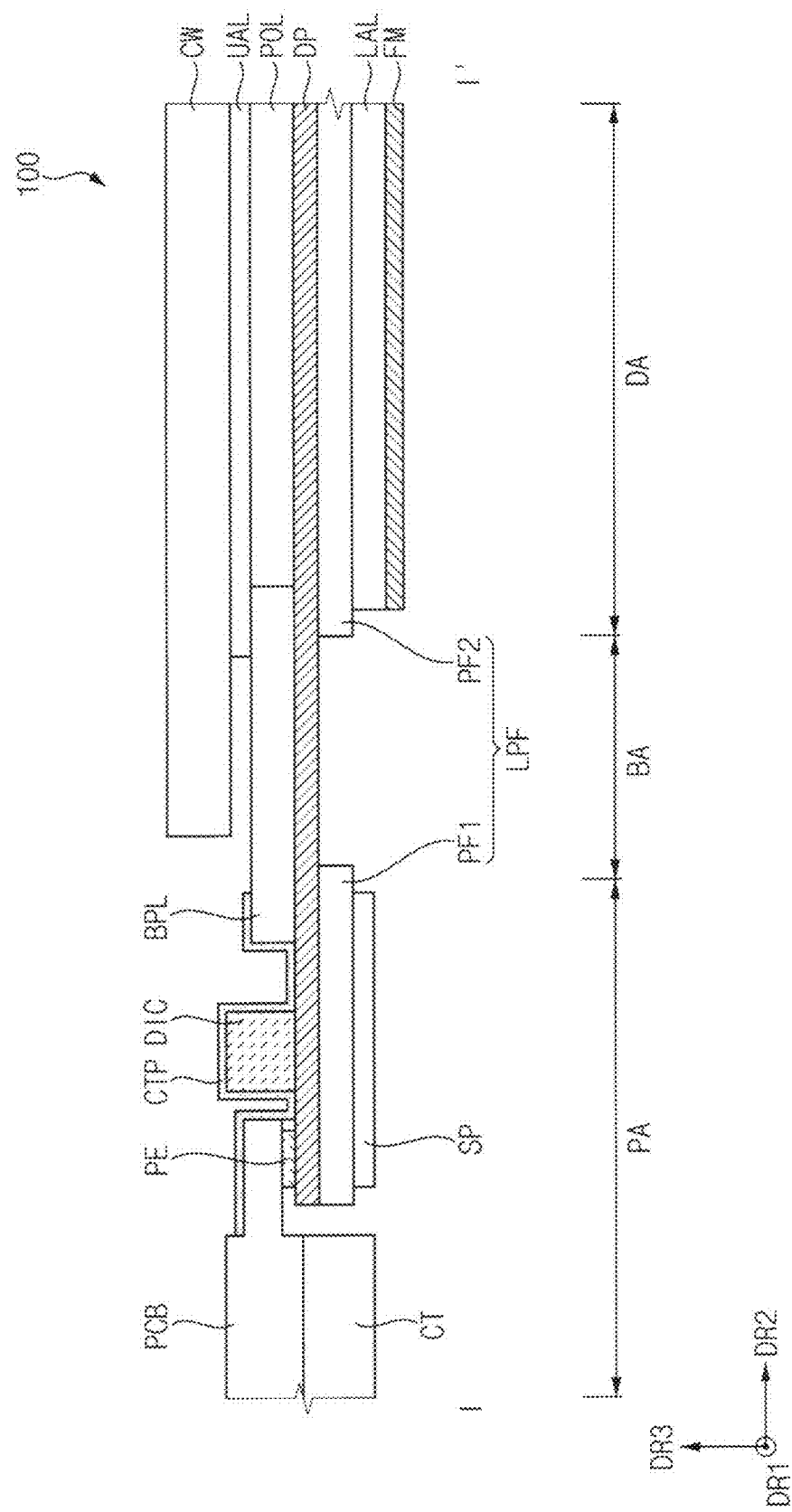
FIG. 3 is a cross-sectional view taken along line I-I' of FIG. 1.
Figure 4:
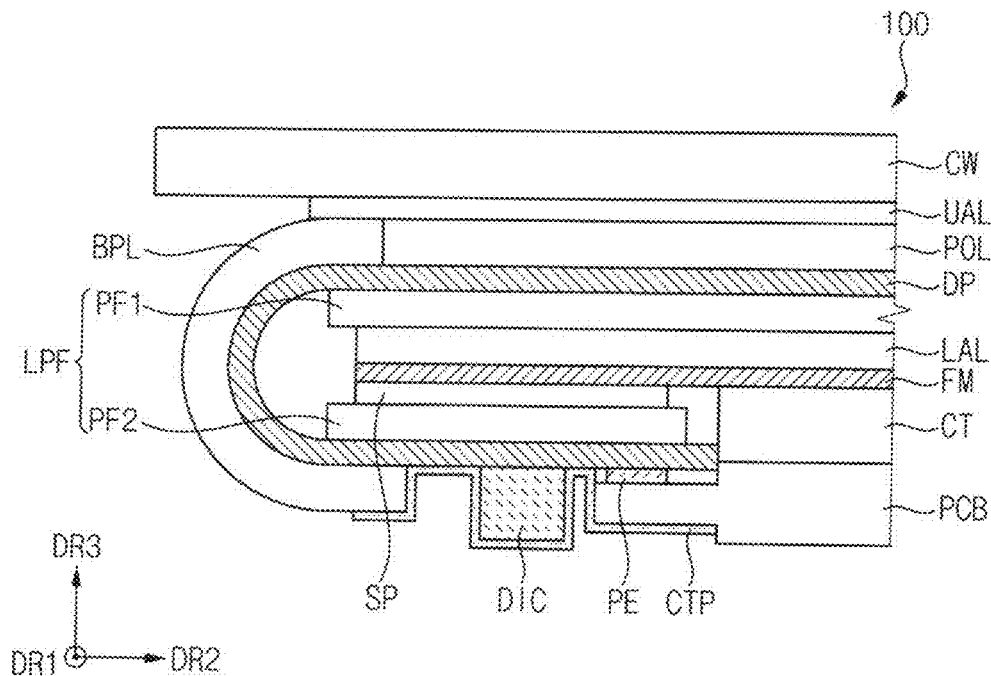
FIG. 4 is a cross-sectional view illustrating a bent shape of the display device of FIG. 3.

FIG. 3 is a cross-sectional view taken along line I-I' of FIG. 1. FIG. 4 is a cross-sectional view illustrating a bent shape of the display device of FIG. 3. For example, the display device 100 illustrated in FIG. 3 is in a state before the display panel DP is bent, and the display device 100 illustrated in FIG. 4 is in a state in which the display panel DP is bent. The display device 100 may be provided in a state in which a portion of the display panel DP overlapping the bending area BA is bent.

Referring to FIGS. 3 and 4, the display device 100 according to an embodiment may include a display panel DP, a lower protective film LPF, a lower adhesive layer LAL, a spacer SP, a functional member FM, a polarizing member POL, a bending protective layer BPL, an upper adhesive layer UAL, a cover window CW, a driver integrated circuit DIC, a cover tape CTP, a printed circuit board PCB, and a conductive tape CT. Here, the display panel DP may include a pad electrode PE, and the lower protective film LPF may include a first protective film PF1 and a second protective film PF2.

The lower protective film LPF may be disposed on a lower surface of the display panel DP. For example, the first protective film PF1 may be disposed in the display area DA on the lower surface of the display panel DP, and the second protective film PF2 may be disposed in the pad area PA on the lower surface of the display panel DP. That is, the lower protective film LPF may not be disposed in the bending area BA on the lower surface of the display panel DP. The lower protective film LPF may protect the lower surface of the display panel DP. For example, the lower protective film LPF may include an organic insulating material such as a photoresist, a polyacrylic resin, a polyimide-based resin, a polyamide-based resin, a siloxane-based resin, an acrylic resin, an epoxy-based resin, and the like. Alternatively, the lower protective film ("LPF") may include polyethylene terephthalate ("PET"), polypropylene ("PP"), polycarbonate ("PC"), polystyrene ("PS"), and polyethylene ("PE"). Each of these may be used alone or in combination with each other.

An adhesive member may be disposed between the display panel DP and the lower protective film LPF. The adhesive member may adhere the lower protective film LPF to the lower surface of the display panel DP. The adhesive member may be disposed in the bending area BA.

The lower adhesive layer LAL may be disposed on a lower surface of the first protective film PF1. The lower adhesive layer LAL may adhere the functional member FM to the lower surface of the first protective film PF1. For example, the lower adhesive layer LAL may include an optical clear adhesive ("OCA"), a pressure sensitive adhesive ("PSA"), an optical clear resin ("OCR"), or the like. These may be used alone or in combination with each other.

The functional member FM may be disposed on the lower surface of a lower adhesive layer LAL. The functional member FM may include a digitizer, a heat sink, or the like. For example, the digitizer may be a device that converts coordinates of the input means into digital data when an input means such as a pen comes into contact with the cover window CW. The digitizer may operate using an electromagnetic resonance method. In addition, the heat sink may dissipate heat transferred to the lower surface of the display panel DP. The heat sink may include a material having high thermal conductivity. For example, the heat sink may include graphite. Alternatively, the heat sink may include aluminum (Al), an alloy containing aluminum, copper (Cu), an alloy containing copper, silver (Ag), an alloy containing silver, or the like. These may be used alone or in combination with each other.

The spacer SP may be disposed on a lower surface of the second protective film PF2. As illustrated in FIG. 4, the spacer SP may compensate for a step difference. Alternatively, the spacer SP may further include an adhesive material, and the spacer SP may be fixed to the lower surface of the functional member FM. For example, the spacer SP may include an organic insulating material. In another embodiment, the spacer SP may include PET, PP, PC, PS, PE, or the like. These may be used alone or in combination with each other.

The polarizing member POL may be disposed in the display area DA on the display panel DP. The polarizing member POL may block external light incident to the display panel DP from the outside.

The bending protective layer BPL may be disposed on the display panel DP. The bending protective layer BPL may be disposed on a portion of the display area DA, the bending area BA, and a portion of the pad area PA. The bending protective layer BPL may raise a neutral plane of the display device 100 in the bending area BA. The bending protective layer BPL may include a photocurable resin or a thermosetting resin. For example, the bending protective layer BPL may include epoxy resin, amino resin, phenol resin, urea resin, melamine resin, unsaturated polyester resin, polyurethane resin, a polyimide resin, or the like. These may be used alone or in combination with each other.

The upper adhesive layer UAL may be disposed on the polarizing member POL and the bending protective layer BPL. The upper adhesive layer UAL may overlap a portion of the bending protective layer BPL and the polarizing member POL. The upper adhesive layer UAL may adhere the cover window CW on the polarizing member POL and the bending protective layer BPL. For example, the upper adhesive layer UAL may include OCA, PSA, OCR, or the like. These may be used alone or in combination with each other.

The cover window CW may be disposed on the upper adhesive layer UAL. The cover window CW may protect the polarization member POL, the bending protection layer BPL, the display panel DP, or the like. The cover window CW may include tempered glass, reinforced plastic, or the like. Alternatively, the cover window CW may be formed as a single layer or may have a structure in which a plurality of functional layers are stacked.

The conductive tape CT may be disposed on the lower surface of the printed circuit board PCB. As illustrated in FIG. 4, when the portion of the display panel DP overlapping the bending area BA is bent, the conductive tape CT may compensate for a step difference. Alternatively, the conductive tape CT may further include an adhesive material, and the conductive tape CT may be fixed to the lower surface of the functional member FM. For example, the conductive tape CT may include an anisotropic conductive film or the like.

The cover tape CTP may be disposed on the pad area PA on the driving integrated circuit DIC. In addition, the cover tape CTP may be disposed on a portion of the bending protective layer BPL and a portion of the connection film CF. In the pad area PA adjacent to the bending area BA, one end of the cover tape CTP may overlap the bending protective layer BPL, and the other end of the cover tape CTP may overlap the printed circuit board PCB. That is, the cover tape CTP may cover the driving integrated circuit DIC. For example, the cover tape CTP may include a synthetic resin such as PET.

In another embodiment, the cover tape CTP may contact only a portion of the bending protection layer BPL and a portion of the printed circuit board PCB. That is, the cover tape CTP may not contact the display panel DP, and an empty space may be formed between the cover tape CTP and the display panel DP.

Figure 5:
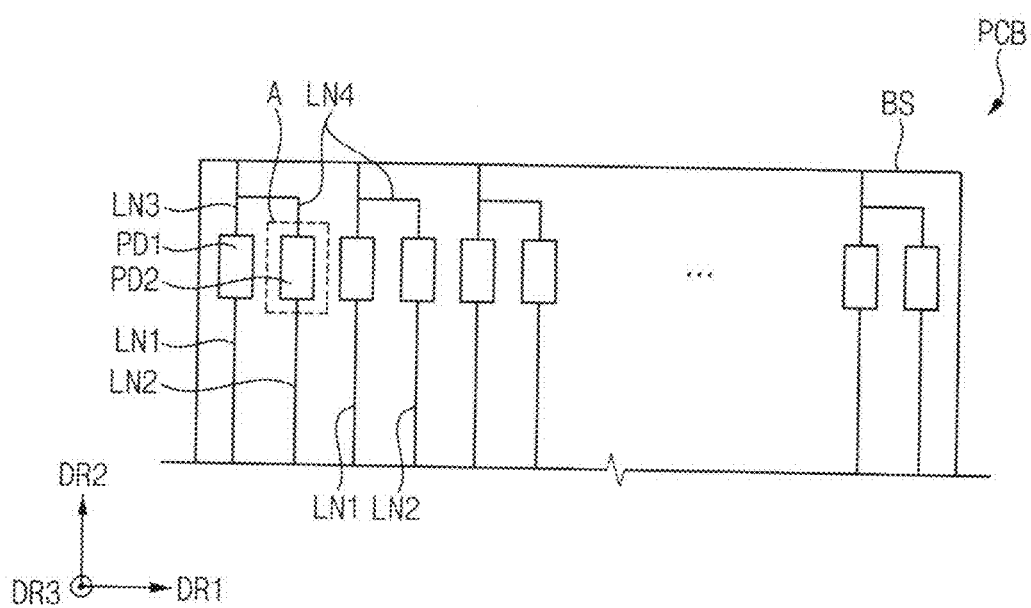
FIG. 5 is a plan view illustrating a portion of the printed circuit board of FIG. 1.
Figure 6:
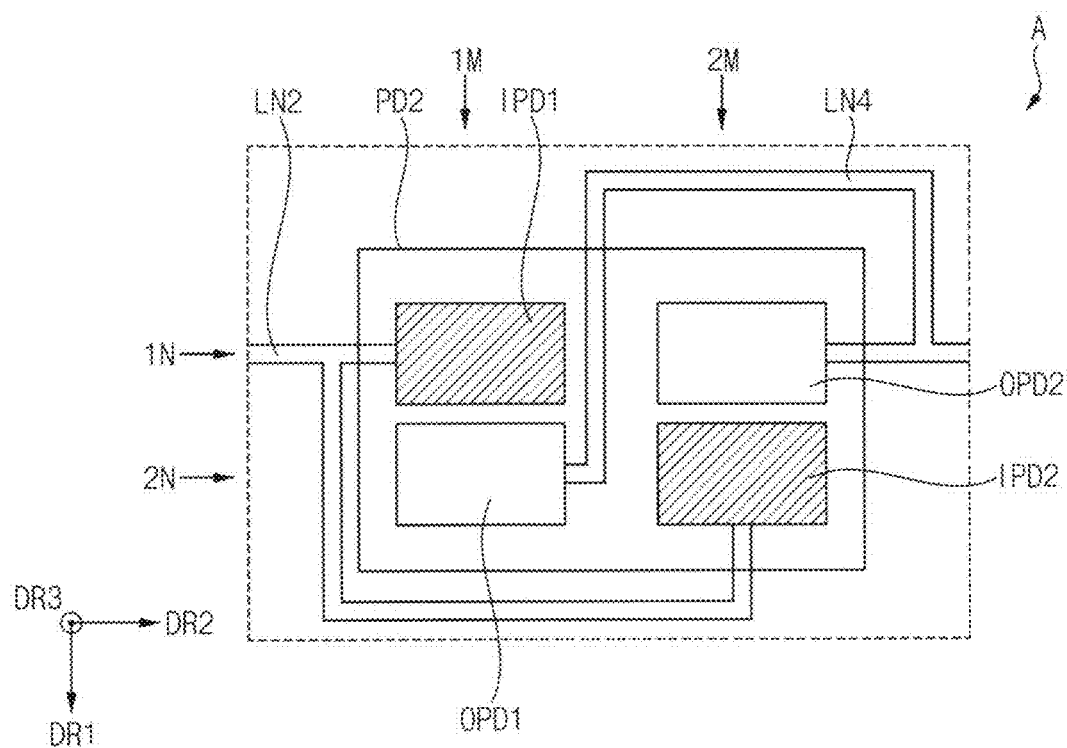
FIG. 6 is a plan view illustrating an enlarged area "A" of FIG. 5.

FIG. 5 is a plan view illustrating a portion of the printed circuit board of FIG. 1. FIG. 6 is a plan view illustrating an enlarged area "A" of FIG. 5.

Referring to FIGS. 5 and 6, the printed circuit board PCB of the display device 100 according to an embodiment may include a base member BS, first pad portions PD1, second pad portions PD2, first lines LN1, second lines LN2, third lines LN3, and fourth lines LN4.

The base member BS may include a material having flexibility. For example, the base member BS may include a polyimide resin, an epoxy-based resin, or the like. These may be used alone or in combination with each other.

The first lines LN1 and the second lines LN2 may be disposed on the base member BS. Each of the first lines LN1 may extend in the second direction DR2 orthogonal to the first direction DR1. The first lines LN1 may be disposed to be spaced apart from each other in the first direction DR1. In addition, each of the second lines LN2 may extend in the second direction DR2. The second lines LN2 may be disposed to be spaced apart from each other in the first direction DR1.

The third lines LN3 and the fourth lines LN4 may be disposed on the base member BS. Each of the third lines LN3 may extend in the second direction DR2. The third lines LN3 may be disposed to be spaced apart from each other in the first direction DR1. In addition, each of the fourth lines LN4 may include a first portion extending in the first direction DR1 and a second portion extending in the second direction DR2. The fourth lines LN4 may be disposed to be spaced apart from each other in the first direction DR1.

The first pad portions PD1 and the second pad portions PD2 may be disposed on the base member BS. The first pad portions PD1 may be disposed to be spaced apart from each other in the first direction DR1. In addition, the second pad portions PD2 may be disposed to be spaced apart from each other in the first direction DR1.

In an embodiment, each of the second pad portions PD2 may include a first input pad IPD1, a second input pad IPD2, a first output pad OPD1, and a second output pad OPD2. That is, each of the second pad portions PD2 may include two input pads (e.g., a first input pad IPD1, and a second input pad IPD2) and two output pads (e.g., a first output pad OPD1, and a second output pad OPD2). In other words, each of the second pad portions PD2 may include four pads. For example, each of the first input pad IPD1, the second input pad IPD2, the first output pad OPD1, and the second output pad OPD2 may include a conductive material.

The first line LN1 may be electrically connected to one end of the first pad portion PD1, and the third line LN3 may be electrically connected to the other end of the first pad portion PD1.

The second line LN2 may be electrically connected to one end of the second pad portion PD2, and the fourth line LN4 may be electrically connected to the other end of the second pad portion PD2. In addition, the fourth line LN4 may be electrically connected to the third line LN3. Specifically, the second line LN2 may be electrically connected to each of the first input pad IPD1 and the second input pad IPD2 of the second pad portion PD2. The fourth line LN4 may be electrically connected to each of the first output pad OPD1 and the second output pad OPD2 of the second pad portion PD2.

In an embodiment, the first line LN1 may be electrically connected to the signal control circuit SC or the power control module PCM illustrated in FIG. 1. In this case, the second line LN2 may not be electrically connected to the signal control circuit SC or the power control module PCM illustrated in FIG. 1. Alternatively, the second line LN2 may be electrically connected to the signal control circuit SC or the power control module PCM illustrated in FIG. 1. In this case, the first line LN1 may not be electrically connected to the signal control circuit SC or the power control module PCM illustrated in FIG. 1.

When the second line LN2 is electrically connected to the signal control circuit SC or the power control module PCM illustrated in FIG. 1, the first input pad IPD1 and the second input pad IPD2 may receive an electrical signal or a voltage through the second line LN2, and the first output pad OPD1 and the second output pad OPD2 may provide the electrical signal or the voltage to the display panel (e.g., the display panel DP of FIG. 1) through the fourth line LN4.

In an embodiment, in a plan view, the first input pad IPD1 and the second input pad IPD2 may be disposed to be spaced apart from each other in a first diagonal direction between the first direction DR1 and the second direction DR2. In addition, in a plan view, the first output pad OPD1 and the second output pad OPD2 may be disposed to be spaced apart from each other in a second diagonal direction intersecting the first diagonal direction. The second diagonal direction may be between the first direction DR1 and a direction opposite to the second direction DR2. For example, in FIG. 6, the second direction DR2 is a direction of the arrow toward the right, and the direction opposite to the second direction DR2 is a direction toward the left.

In an embodiment, for example, in a plan view, the first input pad IPD1 may be disposed in a first row 1N and a first column 1M and the first output pad OPD1 may be disposed in a second row 2N adjacent to the first row 1N and the first column 1M. In addition, in a plan view, the second input pad IPD2 may be disposed in the second row 2N and a second column 2M adjacent to the first column 1M and the second output pad OPD2 may be disposed in the first row 1N and the second column 2M.

In an embodiment, the second line LN2 may be integrally formed (e.g., monolithic) with the first input pad IPD1 and the second input pad IPD2, and the fourth line LN4 may be integrally formed (e.g., monolithic) with the first output pad OPD1 and the second output pad OPD2. That is, the second line LN2 may be formed in the same process as the first input pad IPD1 and the second input pad IPD2, and the fourth line LN4 may be formed in the same process as the first output pad OPD1 and the second output pad OPD2. However, the present invention is not limited thereto. In another embodiment, the second line LN2 may be not formed integrally with the first input pad IPD1 and the second input pad IPD2, and the fourth line LN4 may be not formed integrally with the first output pad OPD1 and the second output pad OPD2, In a plan view, each of the first input pad IPD1, the second input pad IPD2, the first output pad OPD1, and the second output pad OPD2 may have a rectangular shape. However, as will be described later, the planar shape of each of the first input pad IPD1, the second input pad IPD2, the first output pad OPD1, and the second output pad OPD2 is not limited thereto.

Here, pads of each of the first pad portions PD1 may be connected with a 0 ohm resistor, and an input pad (e.g., the first input pad IPD1 or the second input pad IPD2) and an output pad (e.g., the first output pad OPD1 or the second output pad OPD2) of each of the second pad portions PD2 may be connected with an optional resistor. The optional resistor may be formed through soldering. Each of the second pad portions PD2 may be referred to as an optional pad portion.

Figure 7:
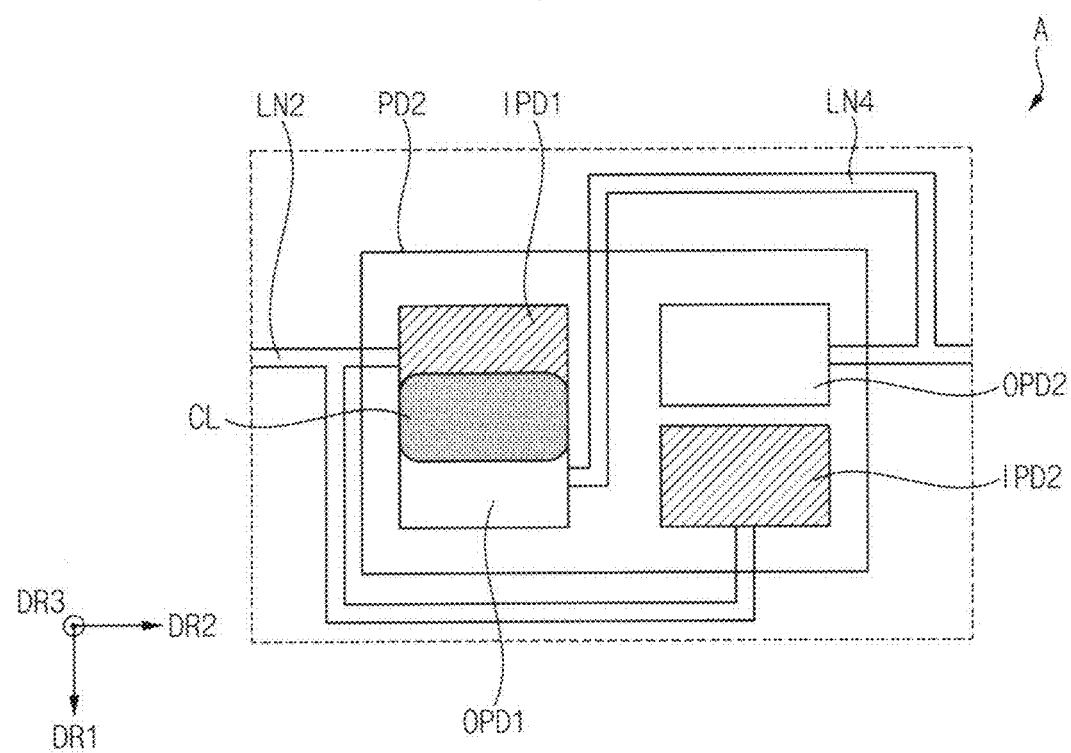
FIGS. 7, 8, and 9 are plan views illustrating a state in which an input pad and an output pad of the second pad portion included in the printed circuit board of FIG. 6 are electrically connected.
Figure 8:
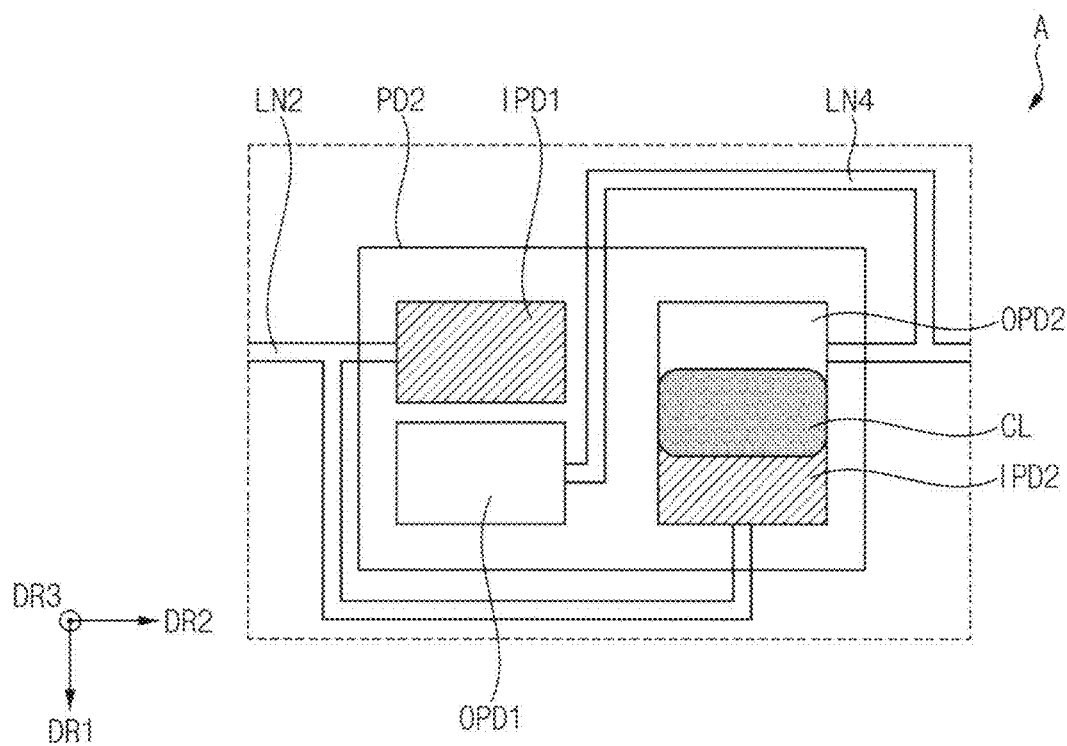
Figure 9:
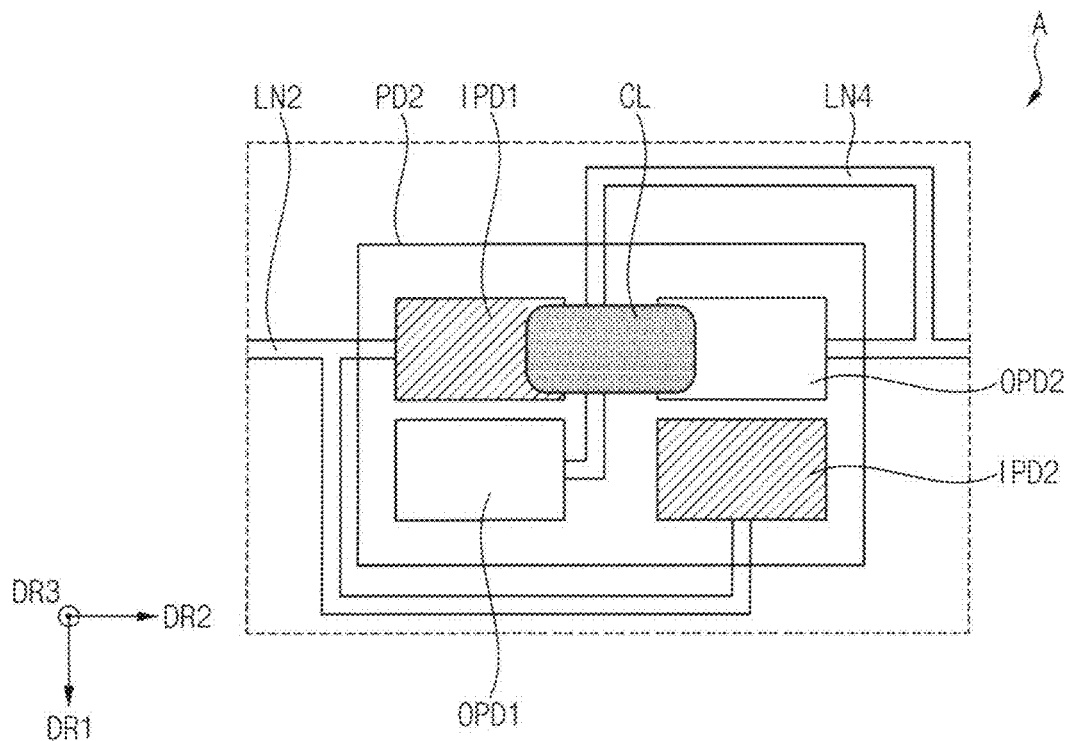

FIGS. 7, 8, and 9 are plan views illustrating a state in which an input pad and an output pad of the second pad portion included in the printed circuit board of FIG. 6 are electrically connected.

Referring to FIGS. 6, 7, 8 and 9, the printed circuit board PCB of the display device 100 according to an embodiment may further include a connection layer CL.

The connection layer CL may electrically connect an input pad (e.g., the first input pad IPD1 or the second input pad IPD2) and an output pad (e.g., the first output pad OPD1 or the second output pad OPD2). In this case, the connection layer CL may contact the input pad and the output pad, respectively.

The connection layer CL may include a metal material. For example, the connection layer CL may include lead (Pb). That is, the connection layer CL may be formed by a soldering process.

As illustrated FIG. 7, the connection layer CL may electrically connect the first input pad IPD1 and the first output pad OPD1 to each other. In this case, the connection layer CL may contact the first input pad IPD1 and the first output pad OPD1, respectively. In addition, the second input pad IPD2 and the second output pad OPD2 may be electrically connected. For example, when the second line LN2 is electrically connected to a component (e.g., the signal control circuit SC or the power control module PCM of FIG. 1) disposed on the printed circuit board PCB, the electrical signal or voltage supplied from the component may transmitted to a display panel (e.g., the display panel DP of FIG. 1) through the second line LN2, the first input pad IPD1, the connection layer CL, the first output pad OPD1, and the fourth line LN4.

As illustrated in FIG. 8, the connection layer CL may electrically connect the second input pad IPD2 and the second output pad OPD2. In this case, the connection layer CL may contact the second input pad IPD2 and the second output pad OPD2, respectively. In addition, the first input pad IPD1 and the first output pad OPD1 may be electrically connected. For example, when the second line LN2 is electrically connected to a component (e.g., the signal control circuit SC or the power control module PCM of FIG. 1) disposed on the printed circuit board PCB, the electrical signal or voltage supplied from the component may transmitted to a display panel (e.g., the display panel DP of FIG. 1) through the second line LN2, the second input pad IPD2, the connection layer CL, the second output pad OPD2, and the fourth line LN4.

As illustrated in FIG. 9, the connection layer CL may electrically connect the first input pad IPD1 and the second output pad OPD2 to each other. In this case, the connection layer CL may contact the first input pad IPD1 and the second output pad OPD2, respectively. In addition, the first input pad IPD1 and the second output pad OPD2 may be electrically connected.

In an embodiment, for example, when the second line LN2 is electrically connected to a component (e.g., the signal control circuit SC or the power control module PCM of FIG. 1) disposed on the printed circuit board PCB, the electrical signal or voltage supplied from the component may transmitted to a display panel (e.g., the display panel DP of FIG. 1) through the second line LN2, the first input pad IPD1, the connection layer CL, the second output pad OPD2, and the fourth line LN4.

In the printed circuit board PCB of the display device 100 according to an embodiment of the present invention, each of the second pad portions PD2 (i.e., the optional pad portions) of the printed circuit board PCB may include the first input pad IPD1 and the second input pad IPD2 that receive the electrical signal or voltage, and may include the first output pad OPD1 and the second output pad OPD2 that provide the electrical signal or voltage to a display panel (e.g., the display panel DP of FIG. 1). That is, each of the second pad portions PD2 of the printed circuit board PCB may include two input pads (e.g., the first input pad IPD1 and the second input pad IPD2) and two output pads (e.g., the first output pad OPD1 and the second output pad OPD2). Accordingly, the possibility of a short between any one of the input pads and any one of the output pads may be improved. In this case, defects of the printed circuit board PCB may be effectively reduced.

Figure 10:
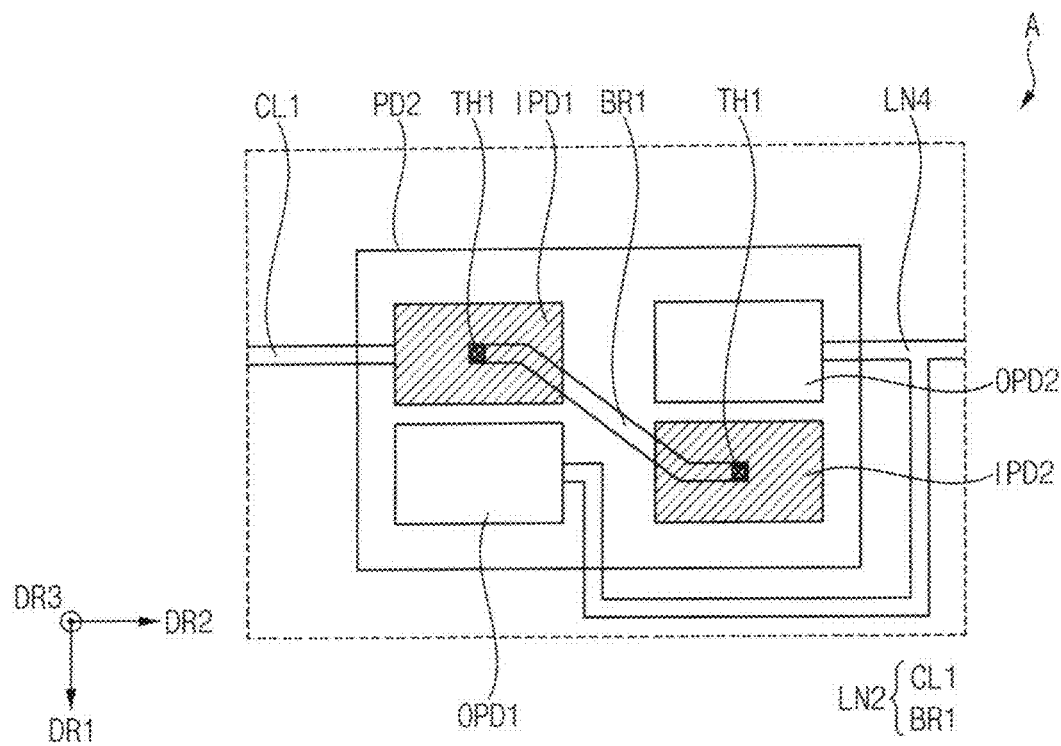
FIGS. 10 and 11 are plan views of an enlarged portion of a printed circuit board of a display device according to another embodiment.
Figure 11:
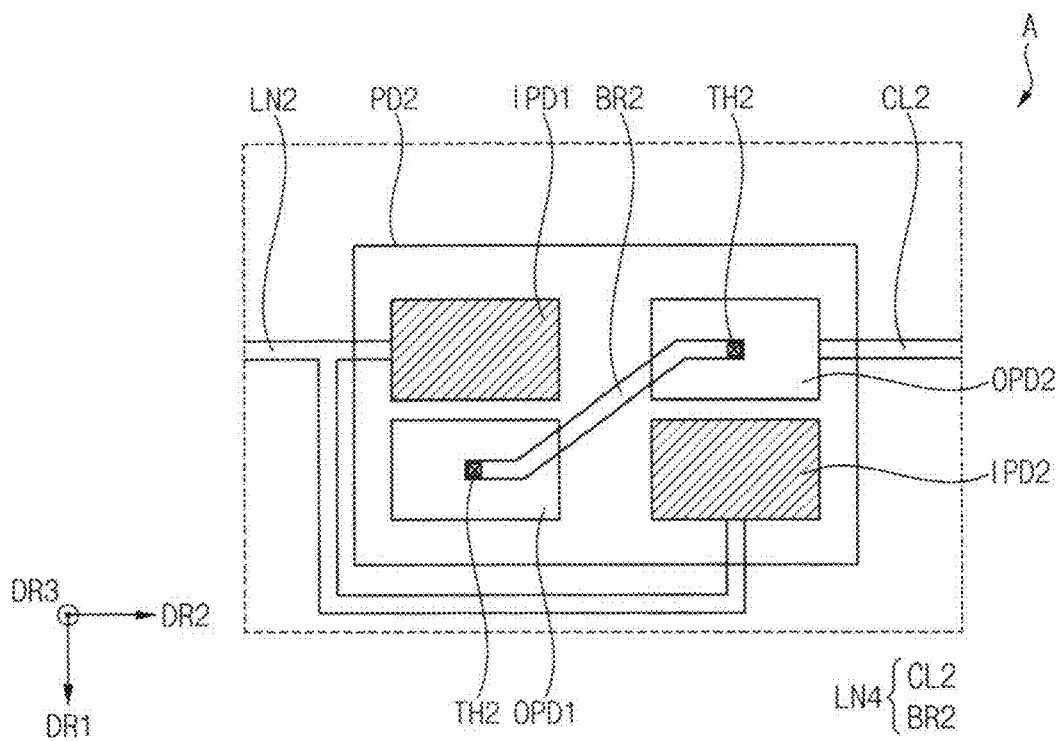

FIGS. 10 and 11 are plan views of an enlarged portion of a printed circuit board of a display device according to another embodiment.

Referring to FIGS. 5, 6, 10, and 11, the printed circuit board PCB of the display device 100 according to an embodiment may include the base member BS, the first pad portions PD1, the second pad portions PD2, the first lines LN1, the second lines LN2, the third lines LN3, and the fourth lines LN4. Hereinafter, descriptions overlapping those of the printed circuit board PCB described with reference to FIGS. 5 and 6 will be omitted.

As illustrated in FIG. 10, the second line LN2 may include a first connection line CL1 and a first bridge line BR1 disposed between the first input pad IPD1 and the second input pad IPD2 in a plan view. In an embodiment, the first connection line CL1 may be electrically connected to the first input pad IPD1, and the first bridge line BR1 may be electrically connected to the first input pad IPD1 and the second input pad IPD2 through first through holes TH1, respectively. That is, the first connection line CL1 may be integrally formed with the first input pad IPD1 and the second input pad IPD2, and the first bridge line BR1 may not be integrally formed with the first input pad IPD1 and the second input pad IPD2 since the first bridge line BR1 may be formed in a different layer from the layer in which the first input pad IPD1 and the second input pad IPD2 are formed. In other words, the first bridge line BR1 may be formed in a process different from a process of the first input pad IPD1 and the second input pad IPD2.

As illustrated in FIG. 11, the fourth line LN4 may include a second connection line CL2 and a second bridge line BR2 disposed between the first output pad OPD1 and the second output pad OPD2 in a plan view. In an embodiment, the second connection line CL2 may be electrically connected to the first output pad OPD1, and the second bridge line BR2 may be electrically connected to the first output pad OPD1 and the second output pad OPD2 through second through holes TH2, respectively. That is, the second connection line CL2 may be integrally formed with the first output pad OPD1 and the second output pad OPD2, and the second bridge line BR2 may not be integrally formed with the first output pad OPD1 and the second output pad OPD2 since the second bridge line BR2 may be formed in a different layer from the layer in which the first output pad OPD1 and the second output pad OPD2 are formed. In other words, the second bridge line BR2 may be formed in a process different from a process of the first output pad OPD1 and the second output pad OPD2.

Figure 12:
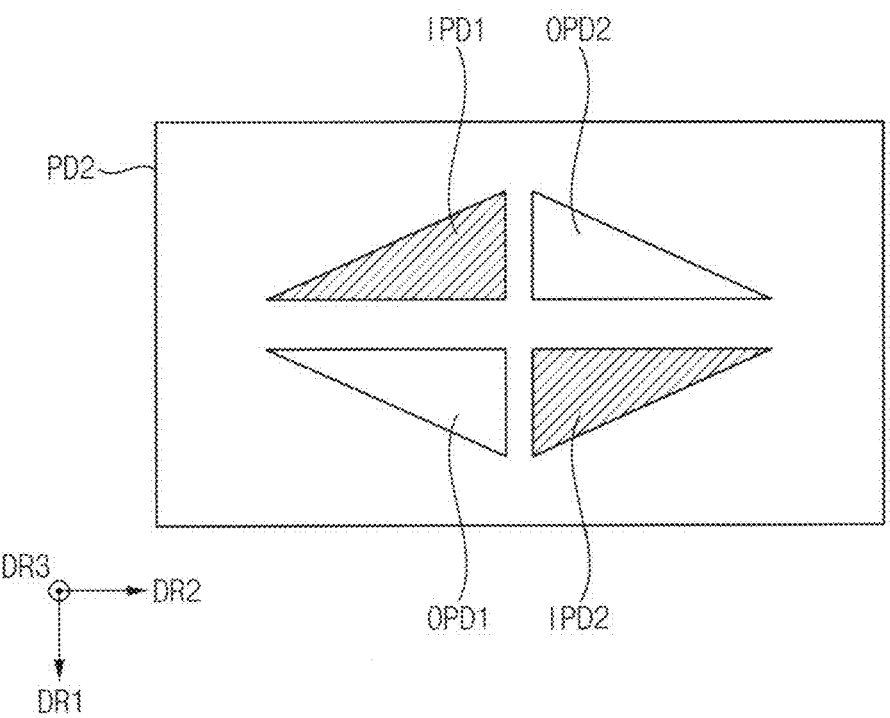
FIGS. 12, 13, and 14 are plan views illustrating a second pad portion included in a printed circuit board of a display device according to still another embodiment.
Figure 13:
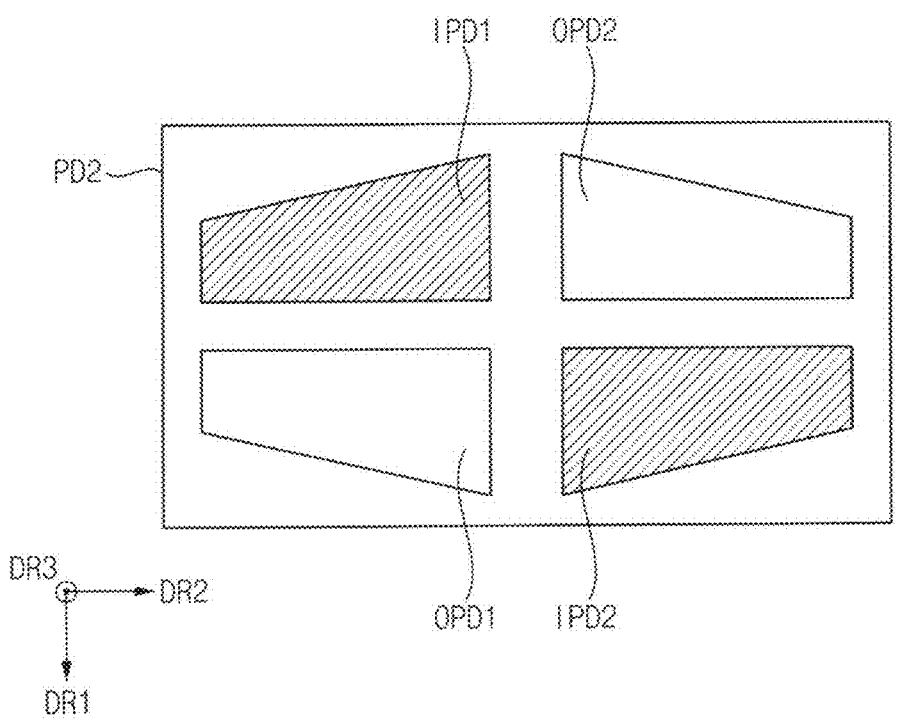
Figure 14:
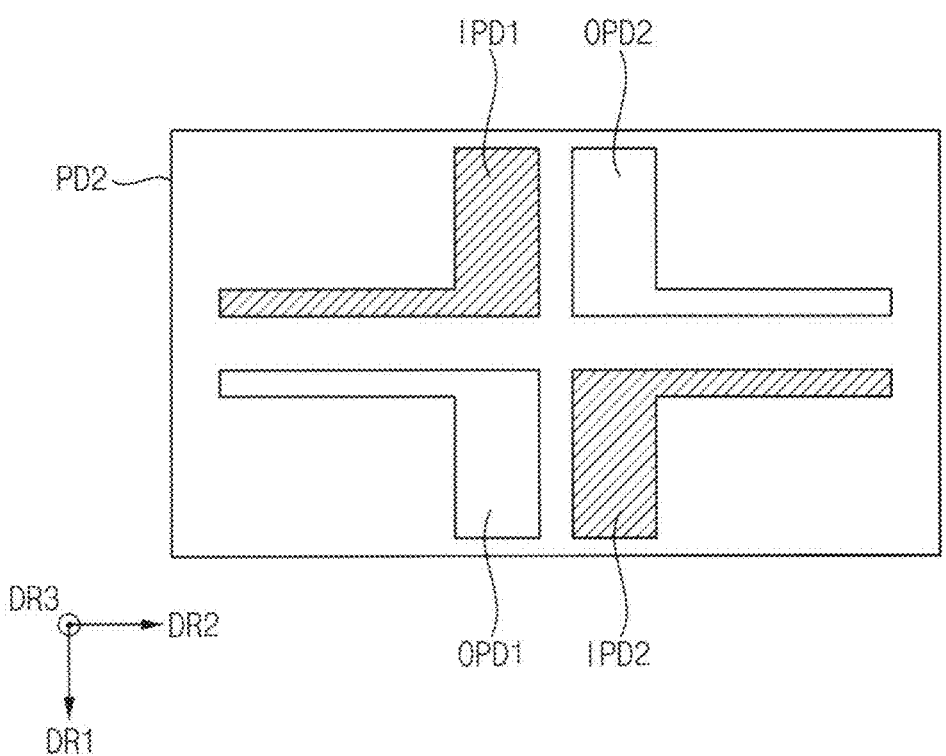

FIGS. 12, 13, and 14 are plan views illustrating a second pad portion included in a printed circuit board of a display device according to still another embodiment.

Referring to FIGS. 5, 6, 12, 13, and 14, the printed circuit board PCB of the display device 100 according to an embodiment may include the base member BS, the first pad portions PD1, the second pad portions PD2, the first lines LN1, the second lines LN2, the third lines LN3, and the fourth lines LN4. Here, each of the second pad portions PD2 may include the first input pad IPD1, the second input pad IPD2, the first output pad OPD1, and the second output pad OPD2. Hereinafter, descriptions overlapping with the components of the printed circuit board PCB described with reference to FIGS. 5 and 6 will be omitted.

As illustrated in FIG. 12, each of the first input pad IPD1, the second input pad IPD2, the first output pad OPD1, and the second output pad OPD2 may have a triangular shape in a plan view. As illustrated in FIG. 13, each of the first input pad IPD1, the second input pad IPD2, the first output pad OPD1, and the second output pad OPD2 may have a rectangular shape in a plan view. As illustrated in FIG. 14, each of the first input pad IPD1, the second input pad IPD2, the first output pad OPD1, and the second output pad OPD2 may have an L-shape in a plan view. However, the configuration of the present invention is not limited thereto, and each of the first input pad IPD1, the second input pad IPD2, the first output pad OPD1, and the second output pad OPD2 may have various shapes in a plan view.

The present disclosure can be applied to various display devices that may include a display device. For example, the present disclosure can be applied to high-resolution smartphones, mobile phones, smart pads, smart watches, tablet PCs, in-vehicle navigation systems, televisions, computer monitors, notebook computers, or the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A printed circuit board comprising:
a base member;
a first line and a second line disposed on the base member; and
a plurality of pad portions disposed on the base member, each of the pad portions including:
a first input pad and a second input pad connected to the first line, respectively, and which receive an electrical signal or voltage; and
a first output pad and a second output pad connected to the second line, respectively, and which provide the electrical signal or the voltage to a display panel,
wherein the first line, the second line, the first input pad, the second input pad, the first output pad, and the second output pad are disposed on a common surface of the base member, and
wherein the first input pad is disposed in a first row and a first column, the first output pad is disposed in a second row adjacent to the first row and the first column, the second input pad is disposed in the second row and a second column adjacent to the first column, and the second output pad is disposed in the first row and the second column.

2. The printed circuit board of claim 1, wherein each of the first input pad, the second input pad, the first output pad, and the second output pad has a rectangular shape in a plan view.

3. The printed circuit board of claim 1, wherein each of the first input pad, the second input pad, the first output pad, and the second output pad has any one of a triangular shape, a square shape, and an L-shape in a plan view.

4. The printed circuit board of claim 1, wherein the first input pad and the second input pad are spaced apart from each other in a first diagonal direction between a first direction and a second direction orthogonal to the first direction in a plan view, and wherein the first output pad and the second output pad are spaced apart from each other in a second diagonal direction between the first direction and a direction opposite to the second direction in the plan view.

5. The printed circuit board of claim 1, wherein the first line is monolithic with the first input pad and the second input pad, and the second line is monolithic with first output pad and the second output pad.

6. A printed circuit board comprising:
a base member;
a first line and a second line disposed on the base member;
a connection layer disposed on the base member and including a metal material; and
a plurality of pad portions disposed on the base member, each of the pad portions including:
  a first input pad and a second input pad connected to the first line, respectively, and which receive an electrical signal or voltage; and
  a first output pad and a second output pad connected to the second line, respectively, and which provide the electrical signal or the voltage to a display panel,
wherein the first line, the second line, the first input pad, the second input pad, the first output pad, and the second output pad are disposed on a common surface of the base member.

7. The printed circuit board of claim 6, wherein the first input pad is disposed in a first row and a first column, the first output pad is disposed in a second row adjacent to the first row and the first column, the second input pad is disposed in the second row and a second column adjacent to the first column, and the second output pad is disposed in the first row and the second column.

8. The printed circuit board of claim 6, wherein the metal material includes lead (Pb).

9. The printed circuit board of claim 6, wherein the connection layer is in contact with the first input pad and the first output pad, respectively.

10. The printed circuit board of claim 6, wherein the connection layer is in contact with the second input pad and the second output pad, respectively.

11. The printed circuit board of claim 6, wherein the connection layer is in contact with the first input pad and the second output pad, respectively.

12. A printed circuit board comprising:
a base member;
a first line and a second line disposed on the base member; and
a plurality of pad portions disposed on the base member, each of the pad portions including:
  a first input pad and a second input pad connected to the first line, respectively, and which receive an electrical signal or voltage; and
  a first output pad and a second output pad connected to the second line, respectively, and which provide the electrical signal or the voltage to a display panel,
wherein the first line, the second line, the first input pad, the second input pad, the first output pad, and the second output pad are disposed on a common surface of the base member, and
wherein the first line includes:
  a first connection line electrically connected to the first input pad; and
  a first bridge line disposed between the first input pad and the second input pad in a plan view, and electrically connected to each of the first input pad and the second input pad through a first through hole.

13. A printed circuit board comprising:
a base member;
a first line and a second line disposed on the base member; and
a plurality of pad portions disposed on the base member, each of the pad portions including:
  a first input pad and a second input pad connected to the first line, respectively, and which receive an electrical signal or voltage; and
  a first output pad and a second output pad connected to the second line, respectively, and which provide the electrical signal or the voltage to a display panel,
wherein the second line includes:
  a second connection line electrically connected to the second output pad; and
  a second bridge line disposed between the first output pad and the second output pad in a plan view, and electrically connected to each of the first output pad and the second output pad through a second through hole.

14. A display device comprising:
a display panel including a display area, a bending area, and a pad area; and
a printed circuit board disposed in the pad area on the display panel,
wherein the printed circuit board including:
  a base member;
  a first line and a second line disposed on the base member; and
  a plurality of pad portions disposed on the base member, each of the pad portions including:
    a first input pad and a second input pad connected to the first line, respectively, and which receive an electrical signal or voltage; and
    a first output pad and a second output pad connected to the second line, respectively, and which provides the electrical signal or the voltage to a display panel,
wherein the first line, the second line, the first input pad, the second input pad, the first output pad, and the second output pad are disposed on a common surface of the base member, and
wherein the first line includes:
  a first connection line electrically connected to the first input pad; and
  a first bridge line disposed between the first input pad and the second input pad in a plan view, and electrically connected to each of the first input pad and the second input pad through a first through hole.

15. The display device of claim 14, wherein each of the first input pad, the second input pad, the first output pad, and the second output pad has any one of a triangular shape, a square shape, and an L-shape in a plan view.

16. The display device of claim 14, wherein the first input pad and the second input pad are spaced apart from each other in a first diagonal direction between a first direction and a second direction orthogonal to the first direction in a plan view, and
wherein the first output pad and the second output pad are spaced apart from each other in a second diagonal direction between the first direction and a direction opposite to the second direction in the plan view.

17. The display device of claim 14, wherein the first line is monolithic with the first input pad and the second input pad, and the second line is monolithic with first output pad and the second output pad.

18. A display device comprising:
a display panel including a display area, a bending area, and a pad area; and
a printed circuit board disposed in the pad area on the display panel,
wherein the printed circuit board including:
a base member;
a first line and a second line disposed on the base member; and
a plurality of pad portions disposed on the base member, each of the pad portions including:
a first input pad and a second input pad connected to the first line, respectively, and which receive an electrical signal or voltage; and
a first output pad and a second output pad connected to the second line, respectively, and which provides the electrical signal or the voltage to a display panel,
wherein the first line, the second line, the first input pad, the second input pad, the first output pad, and the second output pad are disposed on a common surface of the base member, and
wherein the printed circuit board further includes:
a connection layer disposed on the base member, including a metal, and in contact with an input pad including the first input pad or the second input pad and an output pad including the first output pad or the second output pad, respectively.

19. The display device of claim 18, wherein the metal material includes lead (Pb).

20. The display device of claim 18, wherein the first line includes:
a first connection line electrically connected to the first input pad; and
a first bridge line disposed between the first input pad and the second input pad in a plan view, and electrically connected to each of the first input pad and the second input pad through a first through hole.

* * * * *